(12) United States Patent
Galor Gluskin

(10) Patent No.: US 10,567,636 B2
(45) Date of Patent: Feb. 18, 2020

(54) RESOLUTION ENHANCEMENT USING SENSOR WITH PLURAL PHOTODIODES PER MICROLENS

(71) Applicant: QUALCOMM Incorporated, San Diego, CA (US)

(72) Inventor: Micha Galor Gluskin, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 15 days.

(21) Appl. No.: 15/670,728

(22) Filed: Aug. 7, 2017

(65) Prior Publication Data

US 2019/0045111 A1 Feb. 7, 2019

(51) Int. Cl.
  *H04N 5/232* (2006.01)
  *H01L 27/146* (2006.01)
  *H04N 5/3745* (2011.01)
  *H04N 5/225* (2006.01)

(52) U.S. Cl.
  CPC ... *H04N 5/23212* (2013.01); *H01L 27/14621* (2013.01); *H01L 27/14627* (2013.01); *H01L 27/14643* (2013.01); *H04N 5/2254* (2013.01); *H04N 5/23235* (2013.01); *H04N 5/232122* (2018.08); *H04N 5/3745* (2013.01)

(58) Field of Classification Search
  None
  See application file for complete search history.

(56) References Cited

U.S. PATENT DOCUMENTS

| 9,313,393 | B2 | 4/2016 | Olsen et al. | |
|---|---|---|---|---|
| 9,445,018 | B2 | 9/2016 | Fettig et al. | |
| 2010/0245656 | A1* | 9/2010 | Fujii | G02B 7/34 348/345 |
| 2012/0194714 | A1* | 8/2012 | Yamashita | H01L 27/14627 348/294 |
| 2013/0002936 | A1* | 1/2013 | Hirama | H04N 5/23212 348/349 |
| 2013/0083230 | A1 | 4/2013 | Fukuda et al. | |
| 2013/0161774 | A1* | 6/2013 | Okigawa | G02B 3/0056 257/432 |

(Continued)

OTHER PUBLICATIONS

International Search Report and Written Opinion—PCT/US2018/039123—ISA/EPO—dated Oct. 12, 2018.

*Primary Examiner* — Quan Pham
(74) *Attorney, Agent, or Firm* — Duane Morris LLP

(57) ABSTRACT

An imaging system includes a sensor comprising a pixel. The pixel comprises first and second photodiodes sharing a common microlens configured to converge light onto a first area of the first photodiode and a second area of the second photodiode. An effective optical center of the first area is offset from a centroid of the first photodiode. An effective optical center of the second area is offset from a centroid of the second photodiode. A processor is configured to: receive a first luminance value from the first photodiode; receive a second luminance value from the second photodiode; and resample a plurality of luminance values including the first second luminance values to provide a luminance of a first resampled pixel having an optical center at a centroid of the first photodiode and a luminance of a second resampled pixel having an optical center at a centroid of the second photodiode.

22 Claims, 12 Drawing Sheets

(56) References Cited

U.S. PATENT DOCUMENTS

| | | |
|---|---|---|
| 2013/0278730 A1 | 10/2013 | Hasegawa et al. |
| 2015/0062422 A1 | 3/2015 | Stern |
| 2015/0092092 A1 | 4/2015 | Okigawa et al. |
| 2016/0006931 A1* | 1/2016 | Okazawa ................ G02B 7/34 |
| | | 348/222.1 |
| 2016/0295103 A1 | 10/2016 | Ishii |
| 2017/0118395 A1* | 4/2017 | Van Hoeckel ......... G03B 13/36 |

* cited by examiner

RESOLUTION ENHANCEMENT USING SENSOR WITH PLURAL PHOTODIODES PER MICROLENS

CROSS-REFERENCE TO RELATED APPLICATIONS

None.

STATEMENT ON FEDERALLY SPONSORED RESEARCH OR DEVELOPMENT

None.

BACKGROUND

Field of the Disclosure

This disclosure relates, among other things, to image sensors.

Description of Related Art

Digital cameras and many mobile devices (e.g., smartphones, tablets, laptops, and the like) include an imaging assembly having a sensor disposed downstream of optical components. Typical optical components include one or more lenses and apertures. The optical components direct light of a scene onto the sensor, which measures the light. A processor processes the sensor's measurements (luminance and chrominance values) to produce an image.

To record a clear image, the optical components focus light from the scene onto the sensor. If the light is out of focus at the plane of the sensor, then the sensor will capture a blurry image.

SUMMARY

An imaging system includes an image sensor comprising a pixel. The pixel comprises first and second photodiodes sharing a common microlens. The common microlens is configured to simultaneously converge in-focus light onto a first area of the first photodiode and in-focus light onto a second area of the second photodiode. An effective optical center of the first area of the first photodiode is offset from a centroid of the first photodiode. An effective optical center of the second area of the second photodiode is offset from a centroid of the second photodiode. One or more processors are configured to: receive a first luminance value of the first area from the first photodiode; receive a second luminance value of the second area from the second photodiode; and resample a plurality of luminance values including the first luminance value and the second luminance value to provide a luminance of a first resampled pixel having an optical center located at the centroid of the first photodiode and a luminance of a second resampled pixel having an optical center located at the centroid of the second photodiode.

A method of imaging with a sensor having a plurality of pixels is provided. At least one of the plurality of pixels comprises first and second photodiodes. The method comprises: receiving a first luminance value from the first photodiode and a second luminance value from the second photodiode. The first photodiode and the second photodiode share a common microlens. The common microlens is configured so light from a first area is gathered by the first photodiode and has an effective optical center at a first location offset from a centroid of the first photodiode, and so light from a second area is gathered by the second photodiode and has an effective optical center at a second position offset from a centroid of the second photodiode. The second position is different from the first position. Resampling is performed by interpolating among a plurality of luminance values collected by the sensor, including the first luminance value and the second luminance value, to determine a resampled luminance value of a resampled pixel having an optical center located at the centroid of the first photodiode in an evenly spaced row of pixels.

An imaging system comprises a means for receiving luminance values from a plurality of photodiodes sharing a common microlens, such that the luminance values represent light gathered by each respective one of the plurality of photodiodes, and the light gathered by each respective photodiode has an effective optical center at a respective location that is offset from a respective centroid of the respective photodiode. A means for resampling the luminance values interpolates among the received luminance values to estimate respective resampled luminance values of a plurality of resampled pixels having respective optical centers located at respective centroids of each of the plurality of photodiodes.

A non-transitory, machine-readable storage medium comprises computer program code for processing image sensor data. The computer program code comprising code for receiving luminance values from a plurality of photodiodes sharing a common microlens, such that the luminance values represent light impinging on each respective one of the plurality of photodiodes, and the light impinging on each respective photodiode has an effective optical center at a respective location that is offset from a respective centroid of the respective photodiode. The medium also comprises code for resampling the luminance values by interpolating among the received luminance values to estimate respective resampled luminance values of a plurality of resampled pixels having respective optical centers located at respective centroids of each of the plurality of photodiodes.

BRIEF DESCRIPTION OF DRAWINGS

For clarity and ease of reading, some Figures omit views of certain features. Unless expressly stated otherwise, the drawings are not drawn to scale.

DETAILED DESCRIPTION

In some image sensors each imaging pixel has a microlens shared by two photodiodes. The system described below can take advantage of the microlens shape in some sensors to increase the amount of information obtained from each pixel. Each photodiode collects light coming from a different spatial location, and the microlens shape causes light to converge onto different effective optical centers in each photodiode. The effective optical center of each photodiode is offset from the corresponding centroid of the photodiode. A plurality of luminance values including the luminance values from two photodiodes sharing the same microlens are resampled. The resampling uses interpolation to provide a luminance value of a resampled pixel having a corresponding optical center located at the centroid of each corresponding photodiode. The result is an evenly spaced array of resampled pixel data for further image processing and display.

As discussed herein, the centroid of a photodiode refers to a point having a mean position among all the points in the top surface of the photodiodeor a two-dimensional projection of the top surface.

Figure 1:
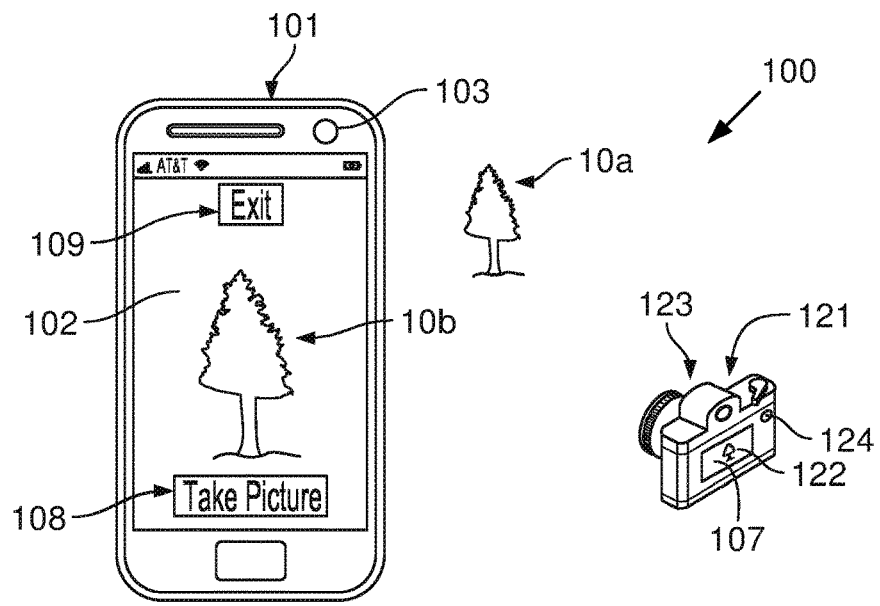
FIG. 1 schematically shows mobile devices capturing a scene.
Figure 2:
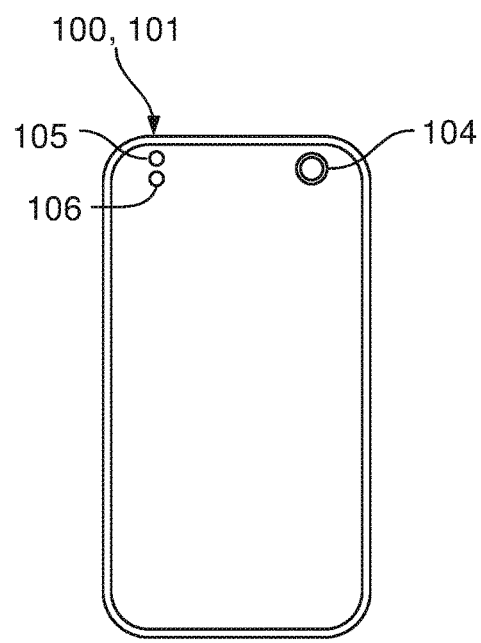
FIG. 2 is a rear view of a mobile device as shown in FIG. 1.

FIG. 1 shows mobile devices 100 capturing a scene 10a. Mobile devices 100 can include smartphones 101, digital cameras 121, tablets, laptops, vehicles, or the like. As shown in FIGS. 1 and 2, smartphone 101 can include a display 102 (e.g., a touchscreen), one or more front-facing imaging assemblies 103 and one or more rear-facing imaging assemblies 104, 105, 106. Digital camera 121 can include rear-facing imaging assembly 107 having a display 122 and a lens assembly 123. Mobile devices 100 can be configured to display soft buttons 108, 109. Mobile devices 100 can include hard buttons 124.

In FIG. 1, mobile devices 100 display an image 10b of scene 10a. To generate the displayed image 10b, a rear-facing imaging assembly 104, 105, 106 of smartphone 101 and lens assembly 123 of digital camera 121 focus light projecting from scene 10a onto their respective sensors. The sensors measure the luminance (and for color sensors, the red, green and blue components) of received light, and an image signal processor converts the data representing luminance and chrominance values into image files. Mobile devices 100 cause the images 10b to be displayed on displays 102, 122.

Figure 3:
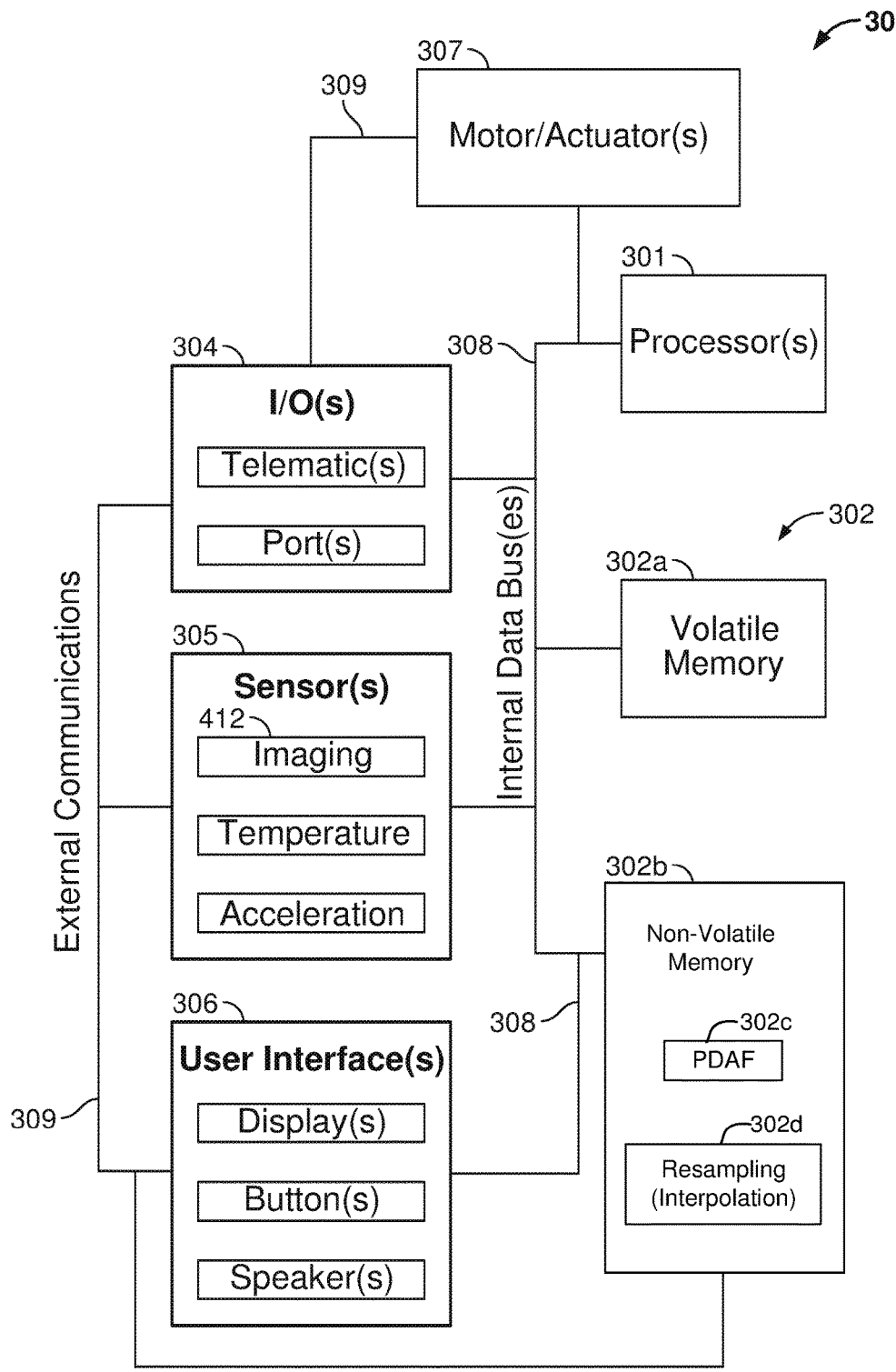
FIG. 3 is a block diagram of a mobile device as shown in FIG. 1.

Mobile devices 100 each include a processing system. As shown in FIG. 3, processing system 300 can include one or more processors 301, volatile memory 302a, non-volatile memory 302b, one or more input/output devices 304, one or more sensors 305, one or more user interfaces 306, one or more motors/actuators 307, one or more internal data busses 308, and one or more external communications interfaces 309.

Although FIG. 3 shows the components of processing system 300 as distinct, a single component of processing system 300 may perform multiple functions. Alternatively, one or more components can perform a single function. For example, a touchscreen display acts as a touch-sensitive input device and as a display output device. In another example, some mobile devices use a single random access memory (RAM) for instructions and data. Other mobile devices can have separate RAMs for instructions and data.

Processor 301 can include one or more distinct processors, each having one or more cores. Each of the distinct processors can have the same structure or respectively different structure. If processor 301 is a general-purpose processor, processor 301 can be configured by program code in memory 302 to serve as a special-purpose processor and perform a certain function or operation. In some mobile devices, a single processor 301 performs image processing functions and other instruction processing. Other mobile devices include a separate image signal processor.

Processor 301 can include one or more central processing units (CPUs), one or more graphics processing units (GPUs), application specific integrated circuits (ASICs), digital signal processors (DSPs), and the like.

Memory 302 can include non-transitory, machine readable storage medium(s), such as volatile memory 302a, non-volatile memory 302b, and any other mediums capable of storing data. Volatile memory 302a only maintains data when supplied with power. Non-volatile memory 302b may maintain data with or without power, and can include flash memory storage, electrically erasable programmable read-only memory (EEPROM), a solid-state drive (SSD), and the like.

Each of volatile memory 302a, non-volatile memory 302b, and any other type of non-transitory machine readable storage device can correspond to a respectively different memory device, located at one or more distinct locations and each having a different structure. Examples of memory 302 include a non-transitory computer-readable media such as random access memory (RAM), read-only memory (ROM), flash memory, electrically erasable programmable ROM (EEPROM), any kind of optical storage disk such as a digital versatile disk (DVD), a "BLU-RAY®" disc, magnetic storage, holographic storage, a hard disk drive (HDD), an SSD, any medium that can be used to store program code in the form of instructions or data structures, and the like.

The methods, functions, and operations described in the present application can be fully or partially embodied in the form of tangible and non-transitory machine-readable storage media encoded with program code. The program code configures the processor 301 as a special-purpose processor for performing a disclosed method or function.

Input-output devices 304 can include any component for receiving or transmitting data such as ports and telematics. Input-output devices 304 can enable wired communication via USB®, DisplayPort®, HDMI®, Ethernet, and the like. Input-output devices 304 can enable optical, magnetic, and holographic communication with suitable memory 302. Communications interfaces can enable wireless communication via WiFi®, Bluetooth®, cellular (e.g., Long-Term Evolution (LTE®), carrier-sense multiple access (CDMA®), Global System for Mobile Communications (GSM®), WiMax®), near-field communications (NFC®), global positioning system (GPS), and the like. Processor 301 and memory 302 can include dedicated processors and memory for performing input-output functions (e.g., an LTE® module can include a dedicated processor, dedicated memory, and a dedicated antenna).

Sensors 305 can capture physical measurements of an environment and report the same to processor 301. Sensors 305 can include laser image detection and ranging (LIDAR) sensors. In addition, the system can include an acceleration sensor, a motion sensor, a gyro, and the like.

User interface 306 enables user interaction with mobile device 100. User interface 306 can include displays (e.g., an LED touchscreen), physical buttons, speakers, microphones, keyboards, and the like.

Motor/actuator 307 can move any optical components of the lens assembly 123 to focus the lens for imaging the subject. Internal data bus 308 can include pathways located within mobile device 100 (e.g., smartphone 101, digital camera 121, vehicle, laptop, etc.). As shown in FIG. 3, internal data bus 308 can transmit data between the processor 301 and the other components of processing system 300. Internal data bus 308 can include conductive paths printed on, or otherwise applied to, a substrate (e.g., a logic board), or a separate bus integrated circuit.

External communications interfaces 309 can include wireless communication paths and wired communication paths. External communications interfaces 309 can include an Internet connection, allowing the processing system 300 to communicate with a second processing system 300, which may be located remotely.

As shown in FIG. 3, components of processing system 300 can be connected via internal data bus 308 and/or external communications interface 309. For example, processor 301 can be configured to store data on remote non-volatile memory 302b, such as an SSD located in a remote server farm. As another example, a user interface 306 can be a touchscreen display connected to processor 301 via an HDMI® or via conductive paths printed on a substrate.

The components of processing system 300 can be components located in a common location (e.g., a single mobile device housing and/or a single room). Alternatively, the components of processing system 300 can be geographically dispersed and connected via wired or wireless (e.g., Internet-based) communication.

Figure 4:
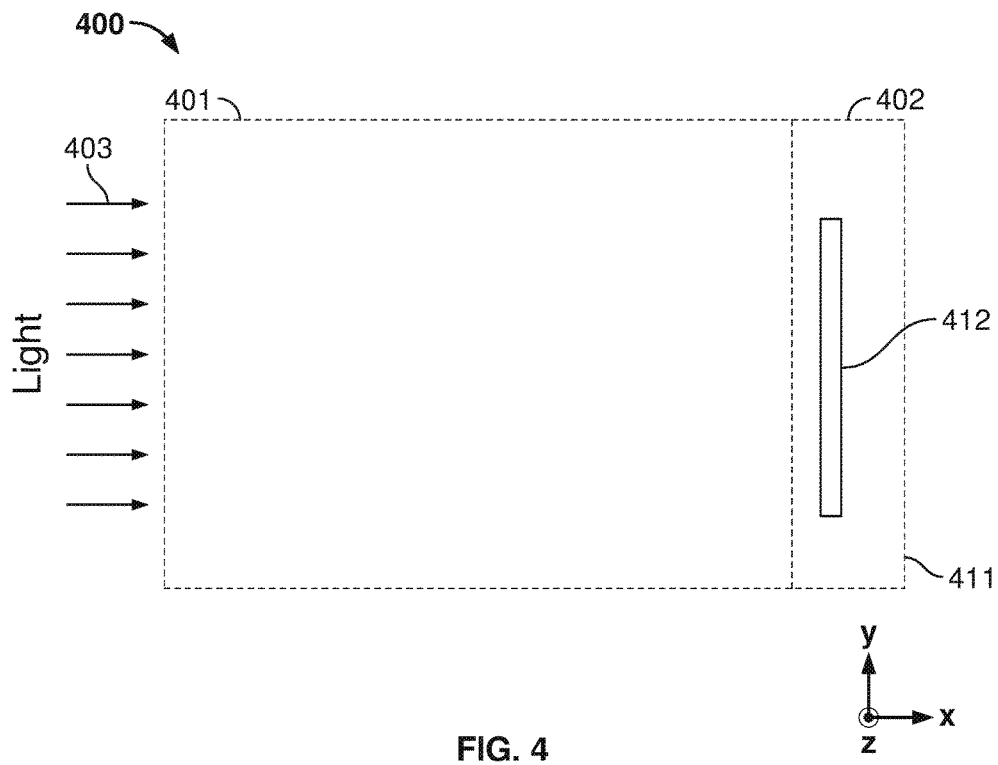
FIG. 4 is a schematic diagram of an optical system of the imaging system of FIG. 3.

FIG. 4 is a schematic diagram of an imaging assembly 400, which can be illustrative of some or all of imaging assemblies 103-106 or lens assembly 123 or other imaging assembly of a mobile device 100 (e.g., an imaging assembly/camera mounted on a vehicle). As discussed below, an imaging assembly 400 comprises image capture hardware, including optics and an imaging sensor 412. Imaging assembly 400 can include upstream optics 401 that are controllable to set the focal length (e.g., a primary lens) and downstream optics 402 within the imaging sensor 412 (e.g., a microlens). Imaging assembly 400 can include a housing or cover assembly for enclosing upstream optics 401 and downstream optics 402.

Upstream optics 401 can be configured to transmit focused light to downstream optics 402. Upstream optics 401 can include lenses (e.g., convex lenses and/or concave lenses), mirrors, shutters, apertures, filters (e.g., color or ultraviolet filters), and the like. Some of these components can include motors/actuators for autofocus adjustment. For example, processor 301 can be configured to: (a) instruct a motor to move (e.g., slide or actuate) a lens of upstream optics 401 along the X axis to focus incoming light 403 on downstream optics 402; (b) instruct a motor to rotate a lens of upstream optics 401 about the Z axis for autofocus adjustment; (c) control opening time of a shutter to yield a certain exposure time.

Processor 301 can use phase detection autofocus (PDAF) to control the motor of upstream optics 401 to capture an image so that a desired region of interest within the field of view is in focus.

Downstream optics 402 can include a sensor 412 (also called an imaging sensor) having photodiodes, microlenses, color filters, and barriers. Imaging sensor 412 can have a rectangular (e.g., square), annular (e.g., circular) perimeter in the Y-Z plane. Imaging sensor 412 can have a width along the Y axis, a thickness along the X axis, and a height along the Z axis.

Imaging sensor 412 can receive light 403 that has passed through upstream optics 401. The light 403 can pass through microlenses and color filters before being gathered by photodiodes. When the photons contact the photodiodes, the photodiodes convert the light to electrical current.

For example, the photons of light 403 can disturb electrons in the photodiodes through the photoelectric effect. Some of the disturbed electrons can fall into an electron well in the photodiode. The number of electrons falling into the electron well corresponds with brightness of the light passing through.

A voltage generated by each photodiode's electron well can correspond to the number of electrons residing within the well. By receiving the voltage values of each electron well, processor 301 can estimate the brightness of light incident upon each photodiode. Processor 301 can use the estimated brightness of light to generate an image file.

Figure 5:
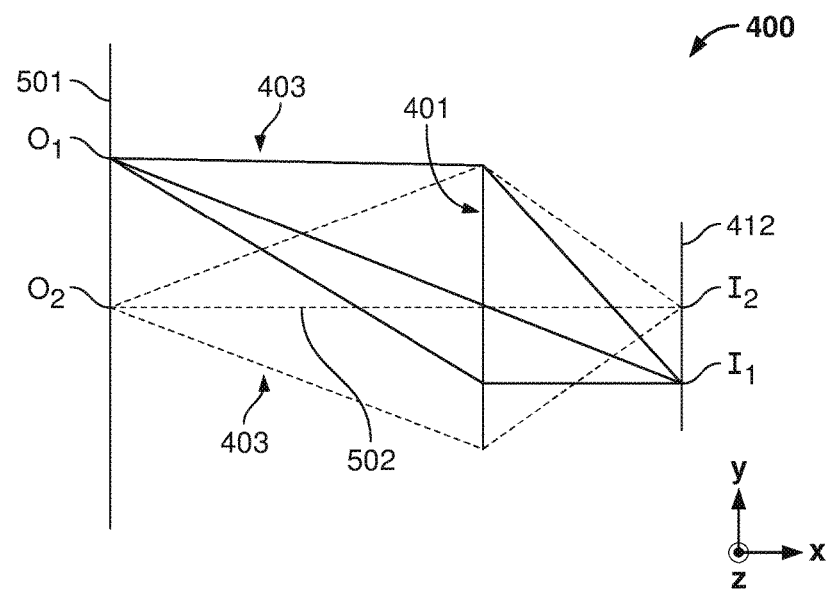
FIG. 5 is a diagram of light rays extending between a scene and the imaging sensor of the mobile device as shown in FIG. 3.

FIG. 5 is a schematic and plan ray diagram illustrating upstream optics 401 focusing light 403 on imaging sensor 412. Upstream optics 401 has been approximated as a plano-convex lens with an optical axis 502.

Rays of light 403 emanate and/or reflect from first object $O_1$ and second object $O_2$ in a scene 501. Upstream optics 401 focuses the light 403, thus causing the rays of light 403 from $O_1$ to converge at a first region $I_1$ on imaging sensor 412 and the rays of light 403 from $O_2$ to converge at a second region $I_2$ on imaging sensor 412. Because first and second regions $I_1$, $I_2$ lie on imaging sensor 412, both first object $O_1$ and second object $O_2$ are in focus on the plane of imaging sensor 412.

Processing system 300 of FIG. 3 is configured to perform an autofocus operation. During autofocus, a user (or processing system 300 automatically) can select one or more focus points, such as focus points in regions $I_1$ and $I_2$, corresponding to regions of interest within the field of view containing objects $O_1$ and $O_2$, respectively. Processing system 300 then controls mechanical adjustment of imaging assembly 400 (e.g., upstream optics 401) based on measurements from imaging sensor 412, so that the region(s) of interest corresponding to the selected focus point(s) is (are) in-focus.

For example, processing system 300 may instruct one or more components of upstream optics 401 to (a) slide along the X-axis or (b) rotate about the Z-axis. According to some examples, upstream optics 401 is configured to move with respect to (e.g., slide along and/or rotate about) the X-axis, the Y-axis, and/or the Z-axis. Exemplary techniques for mechanical control of imaging assembly 400 based on measurements from imaging sensor 412 are discussed below.

The processing system 300 provides a means for receiving luminance values from a plurality of photodiodes sharing a common microlens, such that the luminance values represent light gathered by each respective one of the plurality of photodiodes, and the light gathered by each respective photodiode has an effective optical center at a respective location that is offset from a respective centroid of the respective photodiode.

Figure 6:
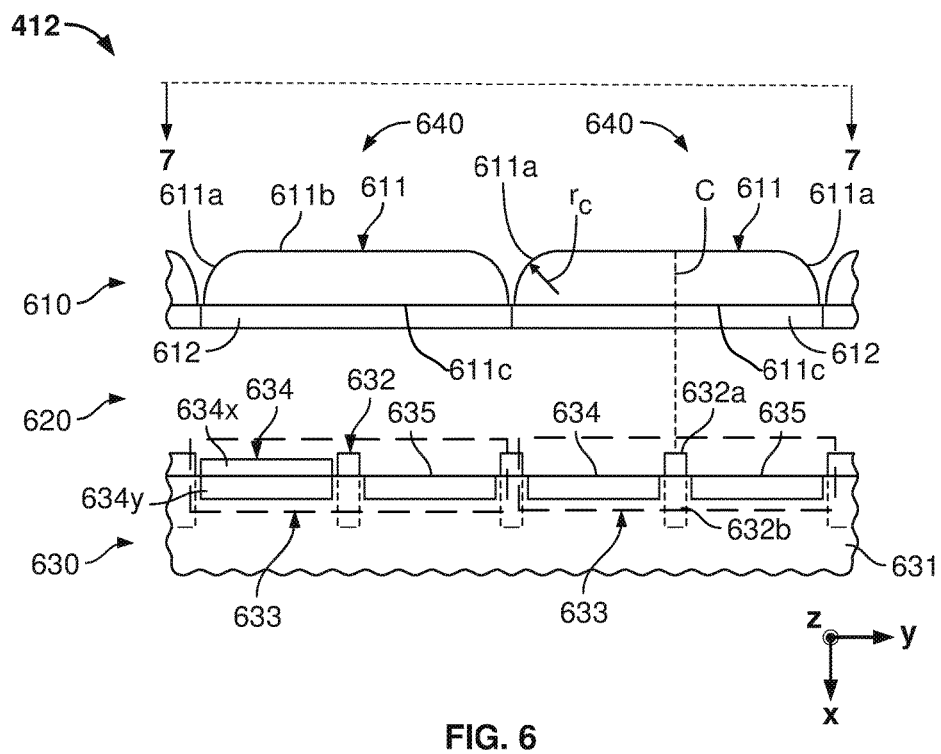
FIG. 6 is a cross sectional view of two pixels in a central region of the imaging sensor of the mobile device as shown in FIG. 3.
Figure 13:
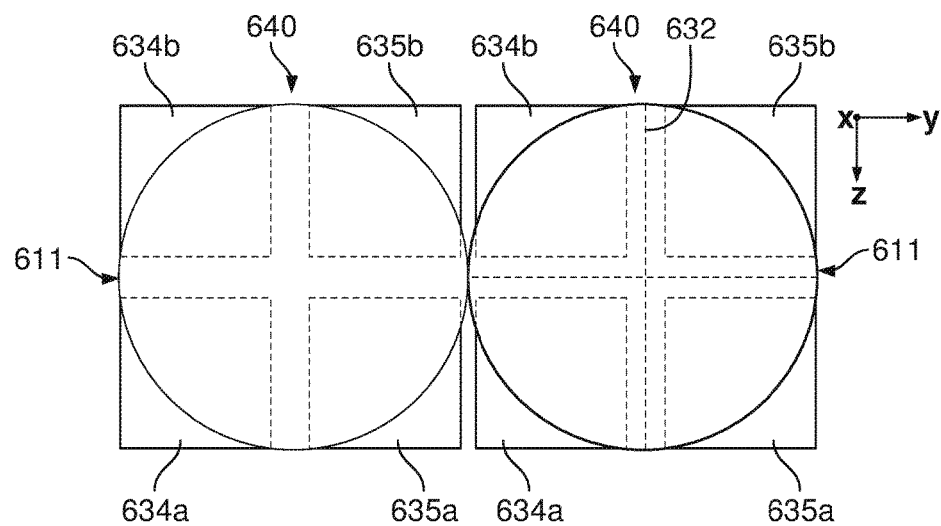
FIG. 13 is a plan view of two pixels in a central region of a sensor having four photodiodes per microlens.

FIG. 6 is a cross sectional view of two pixels 640 in imaging sensor 412. Imaging sensor 412 can include a first layer 630, a second layer 620, and a third layer 610. First layer 630 can include a substrate 631, barriers 632, and photodiode ("PD") groups 633 having individual PDs 634, 635. As discussed herein, a PD group 633 includes all of the photodiodes which share a common microlens. Second layer 620 can include one or more layers of dielectric material (e.g., $SiO_2$ or SiO). Third layer 610 can include an array of microlenses 611 and color filters 612. In the embodiment of FIG. 6, each PD group 633 includes two photodiodes 634, 635. In other embodiments (e.g., as shown in FIG. 13), each pixel can have four photodiodes per microlens, and a PD group includes four photodiodes.

Some sensors (not shown) can have "ideal" microlenses generally shaped as a portion of an elliptic paraboloid or paraboloid of revolution, to converge the incoming collimated light at the centroid of the area of the PD group and increase a percentage of incoming light that falls within the perimeters of the photodiodes. When the upstream optics are focused on the subject, light rays from a point on the subject converge at a point on the sensor.

As shown in FIG. 6, other imaging sensors 412 have microlenses 611 shaped with a top surface (referred to below as a "non-ideal" shape) that deviates from the "ideal" shape of an elliptic paraboloid or paraboloid of revolution. The term "non-ideal" is used herein for convenient identification, but does not characterize the quality the identified microlens.

A non-ideal microlens does not focus light at a single point. For example, in some embodiments, microlenses 611 can have a generally planar top surface 611b, and a curved peripheral region 611a in the top surface. In other embodiments, the top surface 611b of the microlenses may be slightly curved. That is, the curvature of the top surface 611b, if any, is a more gradual curvature than the curvature of the curved peripheral region 611a. In a non-limiting example, the top surface 611b has a radius of curvature larger or substantially larger than the radius of the curved peripheral region 611a. As explained herein, the system can take advantage of the shape of the non-ideal microlens to obtain additional spatial information from each PD group. The microlens 611 deviates sufficiently from the "ideal" (elliptic paraboloid or paraboloid of revolution) shape to cause incoming collimated light to converge in two different locations, with one location on the surface of each respective photodiode 634, 635.

The term "effective optical center" describes the average location of the light gathered by a photodiode. For a pixel having two or more photodiodes and a single microlens, the effective optical center of the light gathered by one of the photodiodes is offset from the centroid of the area occupied by the photodiode.

When the lens is optimally focused on a region of interest, microlens 611 causes light from a point in the region of interest to converge on two different points which are separated from each other by a distance of approximately 0.5 times the pixel size. A first one of the two different points is located on the first photodiode, and a second one of the two different points is located on the second photodiode. As described below, the system and method described herein can take advantage of the separation between the two locations of the effective optical centers of the respective photodiodes 634, 635 to obtain additional spatial information.

Figure 10:
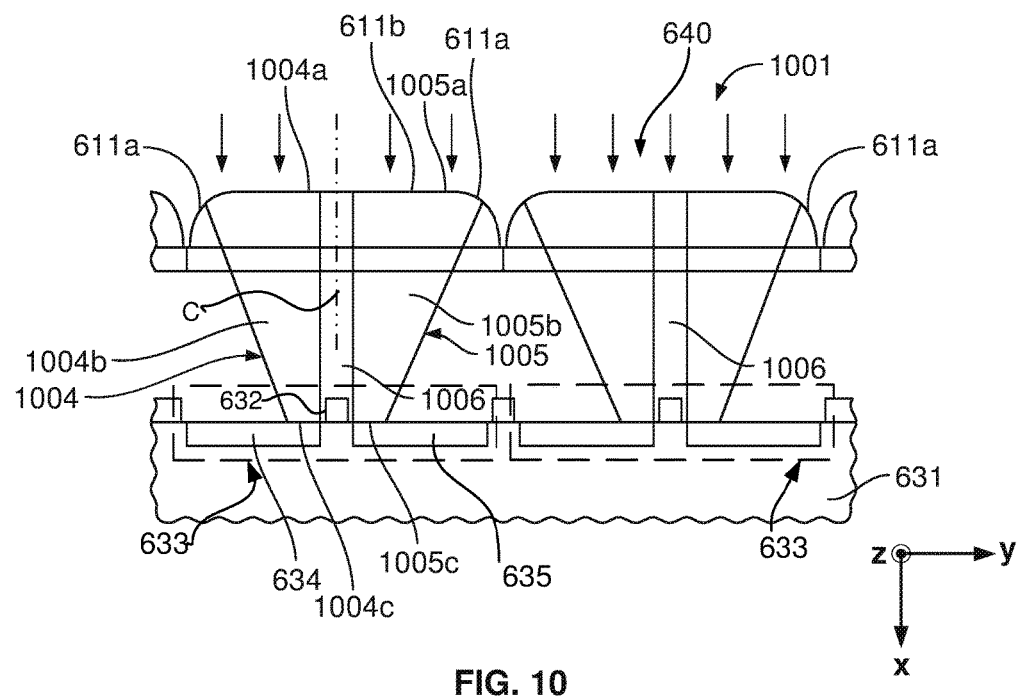
FIG. 10 is a cross sectional view of light rays focused on the plane of the pixels of FIG. 6.

As described below, microlenses 611 can collect focused light and transmit the focused light to all of the photodiodes 634, 634 in each PD group 633. Microlenses 611 can be configured to cause the light to converge. Color filters 612 can remove unwanted light spectrum from respective color channels. For example, a green color filter 612 can be configured to block light having a wavelength less than a predetermined value (e.g., 505 nm) and greater than a second predetermined value (e.g., 530 nm), but admit light having a wavelength of 505-530 nm. Second layer 620 can provide space enabling light transmitted by microlenses 611 and through color filters 612 to converge, as shown in FIG. 10.

Substrate 631 can include a silicon substrate, a germanium substrate, an indium gallium arsenide substrate, or the like. Barriers 632 (also called light shields) can include first portions 632a projecting from substrate 631 toward microlenses 611. First portions 632a can be arranged to isolate adjacent PDs within a PD group 633 and/or to isolate adjacent PD groups 633. First portions 632a can project through second layer 620 until reaching color filter 612. Alternatively, or in addition, barriers 632 can include second portions 632b extending into substrate 631 to isolate adjacent PDs within a PD group 633 and/or to isolate adjacent PD groups 633. First and/or second portions 632a, 632b can include electrical isolation grid segments. In particular, second portions 632b can be a shallow trench isolation region or an implant isolation region.

Each PD 634, 635 can include a plurality of different portions. Each PD can include a first portion (e.g., 634x) extending from substrate 631 toward microlens 611 and a second portion (e.g., 634y) extending into a void defined in substrate 631. For convenience, the first portion 634x is only shown for one PD 634, but can be included in any PD described in the present application. Each PD 634, 635 can include, for example, one or more coatings, contacts, p-n junctions, doped wells, and the like.

As discussed above, PDs 634, 635 can be configured such that photons of incoming light bias electrons toward electron wells. PDs 634, 635 can be configured to output voltages of their electron wells, which are based on the number of incident photons. Due to a greater photon density, brighter light displaces more electrons into the electron wells and dimmer light displaces fewer electrons into the electron wells. As such, the voltage of each PD 634, 635 indicates the brightness of light incident thereon.

A pixel 640 can include one microlens 611, one color filter 612, one PD group 633, and any barriers 632 between adjacent PDs within the PD group 633. FIG. 6 shows two different pixels 640. The above description of PDs 634, 635 can apply to the PDs in each PD group 633. If the imaging sensor 412 is a monochrome sensor, the color filter 612 can be omitted.

In the example of FIG. 6, each microlens 611 can include an arced curved peripheral region 611a, a planar top surface 611b and a planar or generally planar bottom surface 611c. Bottom surface 611c is above the PDs 634, 635, and top surface 611a, 611b is above the bottom surface 611c. In other sensor examples (not shown), the central portion of top surface 611b of the microlens 611 approximates a flat surface. That is, the curvature of the top surface 611b, if any, is a more gradual curvature than the curvature of the curved peripheral region 611a. The shape of the microlens 611 can be a paraboloid, an elliptic hyperboloid, a hemisphere, half of a prolate spheroid, half of a spherical ellipsoid, half of an oblate spheroid or other aspherical shape. The radius of curvature $r_c$ may be constant or variable. The microlens 611 can have any shape that converges collimated light received by the microlens 611 on respectively different effective optical centers in each respective photodiode.

In a non-limiting example, the top surface 611b has a radius of curvature much larger than an edge of the curved peripheral region 611a. For example, a substantially planar central portion 611b of the microlens 611 may have a radius of curvature about 10-50 times larger than the radius of curvature of the peripheral region of arced top surface 611a.

Figure 7:
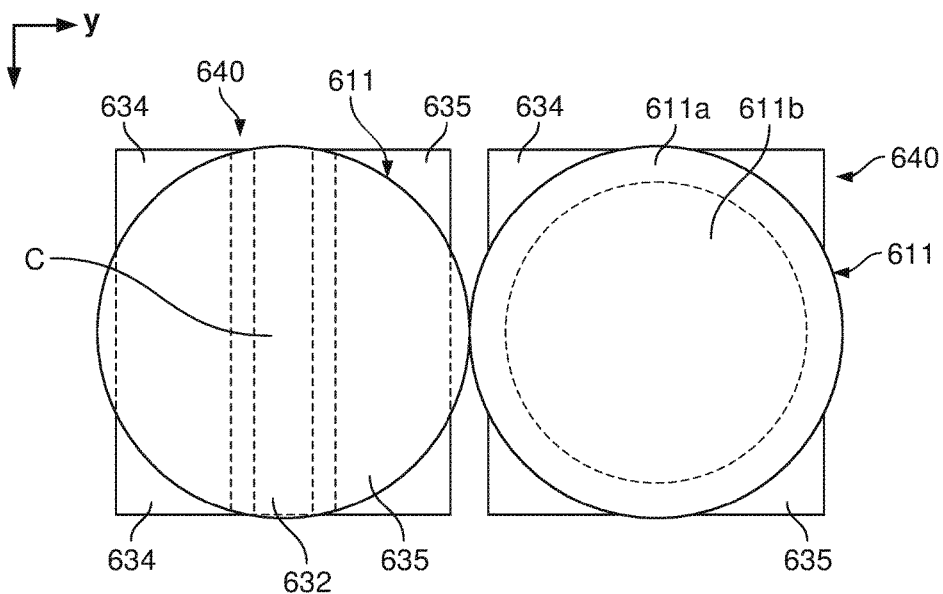
FIG. 7 is a plan view of the two pixels in FIG. 6.

FIG. 7 is a plan view as viewed from section line 7-7 of FIG. 6. If microlens 611 is circular in plan, then the curved peripheral region may be an annular region. Each curved peripheral region 611a may have a cross section with a radius of curvature $r_c$, as shown in FIG. 6. With respect to a pixel 640, and as further discussed below, microlens 611 is configured to converge light and provide the converged light to PD group 633. In FIG. 7, microlens 611 at least partially covers photodiodes 634, 635.

The depicted structures of pixels 640 are only examples of the many pixel structures consistent with the present application.

Figure 8:
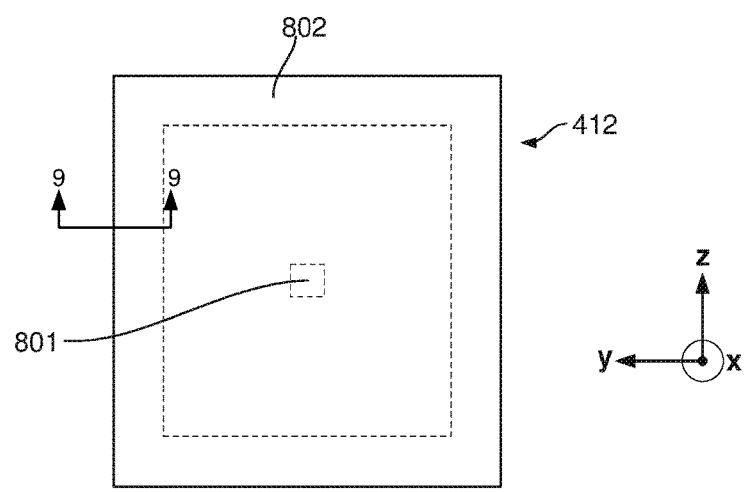
FIG. 8 is a plan view of the imaging sensor of the mobile device as shown in FIG. 3.

In some sensors, a subset of the pixels 640 within a single imaging sensor 412 can have different structures from the remaining pixels. With reference to FIG. 8, some pixels may be disposed in a central region 801 of imaging sensor 412, while other pixels may be disposed in a peripheral region 802 of imaging sensor 412. In central region 801, incoming light is approximately normal to planar top surface 611b. Central region 801 may represent a minority or a majority portion of imaging sensor 412. Pixels 640 of FIG. 6 may be disposed in central region 801 of imaging sensor 412.

Figure 9:
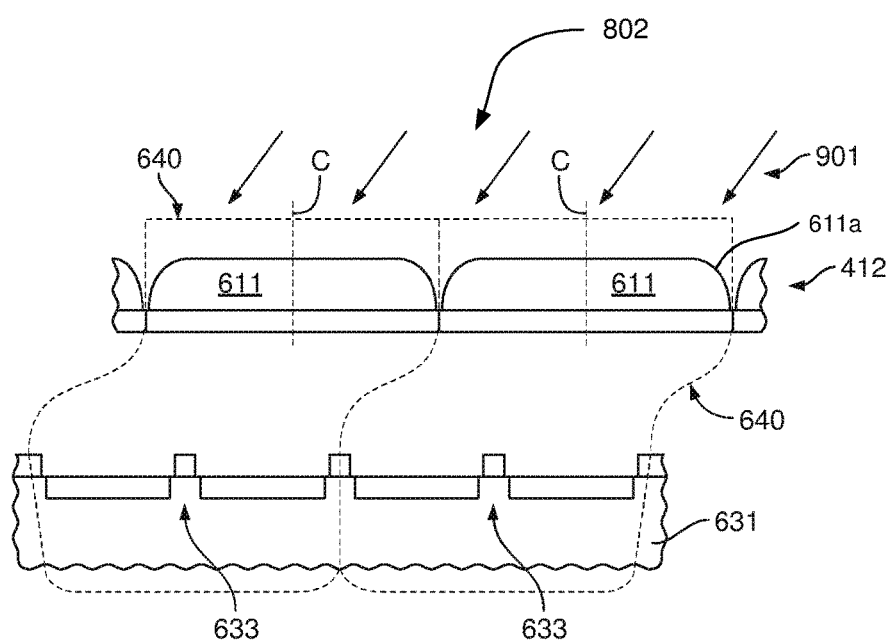
FIG. 9 is a cross sectional view of top pixels at a peripheral region of the sensor of FIG. 8.

In peripheral region 802, and as shown in FIG. 9, incoming collimated light 901 can be approximately normal to a point on curved peripheral region 611a and thus PD group 633 can be offset with respect to microlens 611. The offset enables microlens 611 to converge angled light onto PD group 633 corresponding to the microlens 611. The amount of offset in a pixel 640 can be based on a distance from the pixel 640 to central region 801. For the reader's convenience, the Figures, other than FIG. 9, depict pixels 640 disposed in central region 801.

FIG. 10 shows incoming, in-focus, and collimated light 1001 incident on pixels 640 in central region 801 (FIG. 8). In both FIGS. 9 and 10, upstream optics 401 have already focused light 901, 1001 on imaging sensor 412. The light 901, 1001 is considered collimated because the lens is adjusted so the region of interest (e.g., $O_2$ of scene 501) corresponding to the focus point selected by the user is in focus.

As shown in FIG. 10, each microlens 611 causes collimated focused light 1001 to converge so light converges on an optical area 1004c, 1005c of each PD 634, 635. The optical area 1004c, 1005c of each photodiode 634, 635 is the portion of the area of the photodiode illuminated by the incoming light. Curved peripheral region 611a causes incoming light to bend radially inward, toward central axis C. Light incident on planar top surface 611b proceeds in the same direction.

FIG. 10 shows that light 1001 comprises three portions. A first portion 1004 converges onto a first area of first PD 634. A second portion 1005 converges onto a second area of second PD 635. A third portion 1006 is incident upon barrier 632 and/or the region between PDs 634, 635.

As shown in FIG. 10, focused light 1004a, 1005a, impinges on a surface area (the top surface area of microlens 611). The focused light converges as indicated by converging rays 1004b, 1005b. The converged focused light is gathered by the optical area 1004c, 1005c within the surface area on each respective photodiode 634, 635.

By converging the light the first area of the first PD 634 and the second area of the second PD 635, microlens 611 can cause a greater percentage of incoming photons to impinge on the PDs 634, 635 and be converted to current by the PDs 634, 635.

Figure 11:
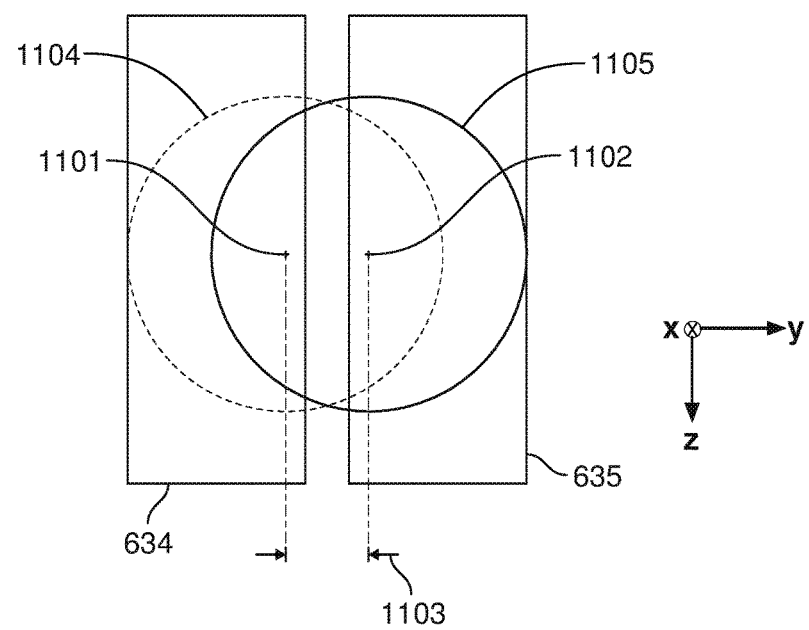
FIG. 11 is a plan view of two of the photodiodes of FIG. 6 with overlaid illumination areas of in-focus light.

With reference to FIG. 11, the light 1004, 1005 impinges on a portion 1104, 1105 (referred to herein as the "optical area") of the area of each respective photodiode 634, 635. That is, the optical area 1104 (1105) of a photodiode 634 (635) is the portion of the area of the photodiode that gathers light passing through the microlens 611. Each of first and second optical areas 1104, 1105 can correspond to a respective region of interest in scene 501. The union of first and second optical areas 1104, 1105 can roughly correspond to the field of view from microlens 611. First optical area 1104 is shown in phantom, and second optical area 1105 is shown in solid lines. First and second optical areas 1104, 1105 can have respective first and second effective optical centers 1101, 1102, separated by distance 1103. As used herein, the term "effective optical center" refers to the average location of light gathered by the photodiode. The effective optical centers 1101, 1102 can be obtained by detecting a light flux distribution function throughout the first and second optical areas 1104, 1105, integrating the light flux distribution function times y over the first and second optical areas 1104, 1105, individually, and dividing the integrals by the integral of the light flux over first and second areas, respectively. In the example of FIG. 11, the z coordinates are assumed to be the same as the z coordinates of the centroids of the respective photodiodes, because of symmetry. The y coordinate ($\bar{y}$) of the effective optical center 1101, 1102 is given by equation (1).

$$\bar{y} = \frac{\int\int Iy\,dy\,dz}{\int\int I\,dy\,dz} \quad (1)$$

where I is the light flux on a differential area dydz, and the double integral for each respective photodiode is integrated over the respective optical area of the photodiode.

As shown in FIG. 11, the light beams passing through the left and right portions of microlens 611 can overlap. Put differently, light 1004 incident on first PD 634 can include rays of light from a first area of scene 501 and light 1005 incident on second PD 635 can include rays of light from a second area of scene 501. The first and second areas of scene 501 can partially overlap, but the non-overlapping areas provide additional spatial information in each PD 634, 635. The amount of light gathered by the second photodiode 635 can be different from the amount of light gathered by first photodiode 634. As the distance 1103 between the effective optical centers 1101, 1102 increases, the amount of additional spatial information increases. As the distance 1103 between the effective optical centers 1101, 1102 approaches the centroid-to-centroid distance between photodiodes 634 and 635, the amount of information (for a sensor having two photodiodes per microlens) approaches twice the information provided by a sensor having a single photodiode per microlens. As the distance 1103 approaches zero, the amount of information (for a sensor having two photodiodes per microlens) approaches the same amount of information provided by a sensor having a single photodiode per microlens.

Figure 12:
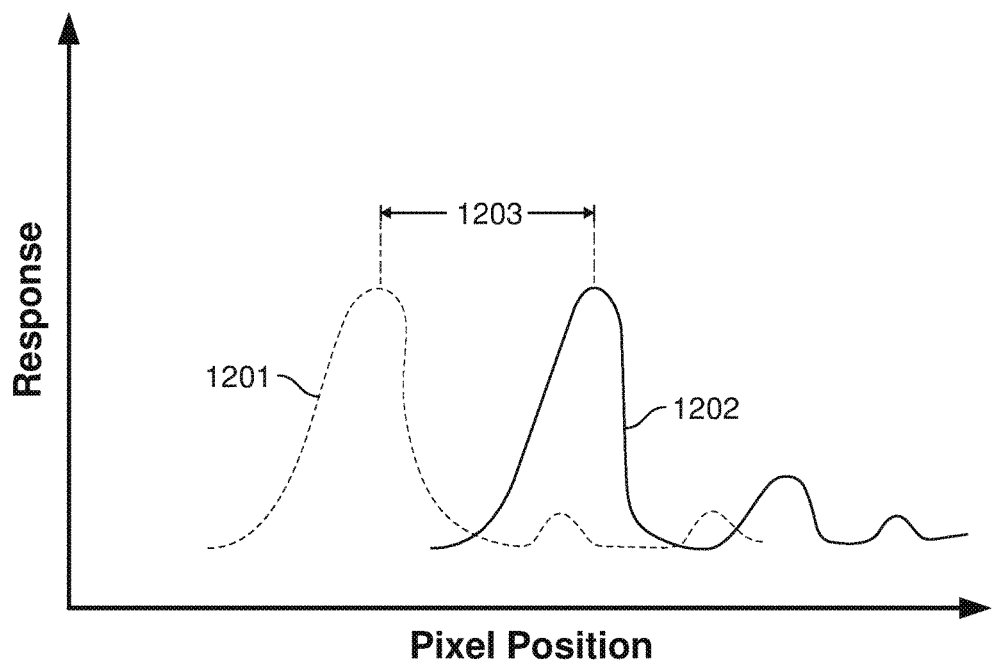
FIG. 12 is a graph of photoelectric response versus position relative to two photodiodes of FIG. 9.
Figure 18:
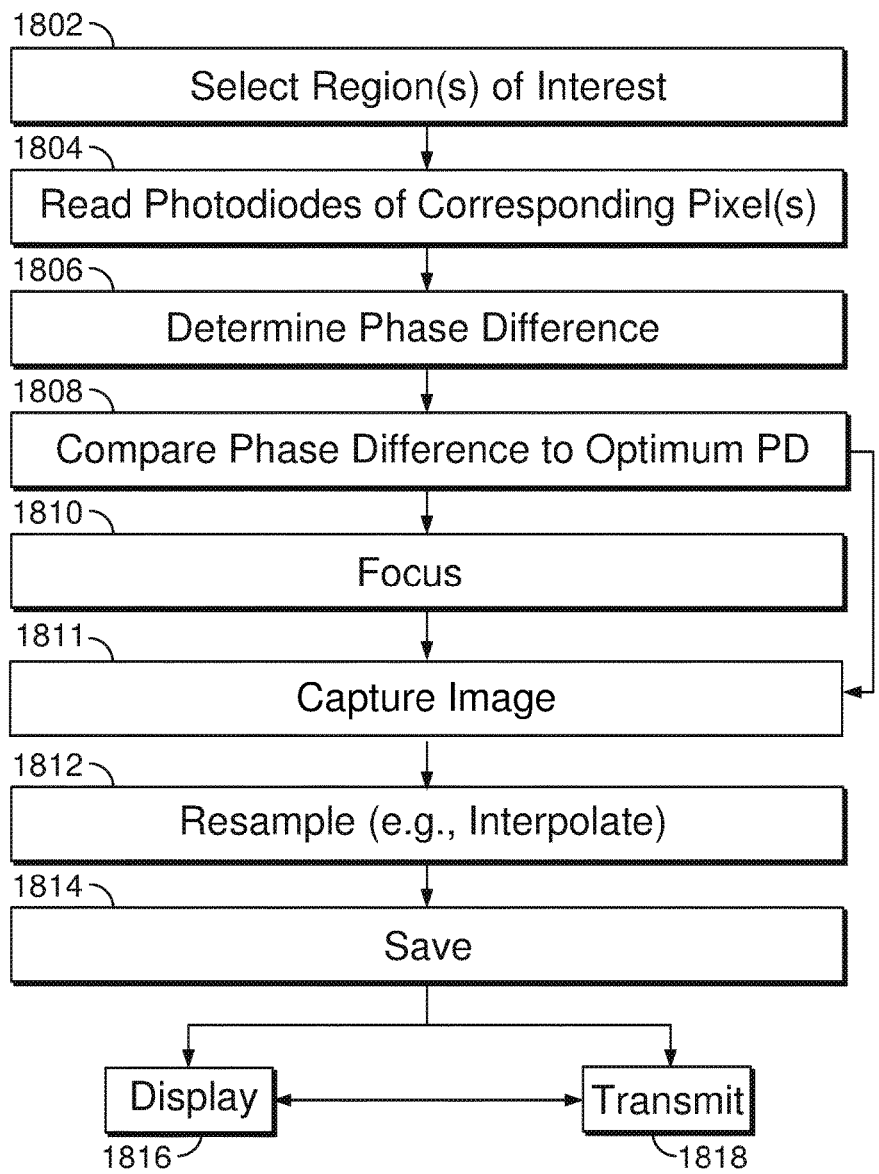
FIG. 18 is a block diagram of an exemplary method.

Referring to FIGS. 12 and 18, processing system 300 of FIG. 3 can apply the distance between the effective optical centers 1101, 1102 during autofocus. Each imaging pixel provides a first photodiode and a second photodiode that can be used both for imaging and for phase detection autofocus (PDAF). As discussed above, processing system 300 has a PDAF block 302c (FIG. 3) that provides a means for generating a lens positioning signal for a lens, based on a phase difference determined using at least two of the plurality of photodiodes. PDAF block 302c detects a phase difference between light arriving at a first one of the plurality of photodiodes and light arriving at a second one of the plurality of photodiodes. PDAF block 302c generates the lens positioning signal for positioning the lens so that the phase difference between light arriving at the first one of the plurality of photodiodes and light arriving at the second one of the plurality of photodiodes has a predetermined non-zero value.

Intensity profile 1201 is an of a response of a plurality of consecutive and identically oriented first PDs 634 of a plurality of consecutive PD groups 633. Intensity profile 1202 can be an exemplary response of a plurality of consecutive and identically oriented second PDs 635 of the same consecutive PD groups 633. For a sensor (not shown) having an "ideal" paraboloid shaped microlenses, the peak-to-peak distance 1203 is the phase difference (phase disparity), and is zero at optimal focus. For the "non-ideal" sensor discussed herein, the peak-to-peak distance 1203 has a non-zero value when the lens is optimally focused.

Intensity profiles 1201 and 1202 are similar in shape due to the overlapping optical information sensed by the first and second PDs 634, 635 of each PD group 633. The horizontal axis of FIG. 12 corresponds to pixel position along a particular axis (e.g., the Y axis of FIG. 10). The vertical axis of FIG. 12 corresponds to PD response (e.g., brightness measured or electrons deposited in an electron well). The distance between similar features of intensity profiles 1201, 1202 is peak-to-peak distance 1203. Horizontal and vertical, as used herein, relate to the graph of FIG. 12, and do not necessarily correspond to any particular axis.

As further discussed below, a processing system 300 can generate pixel data from a single exposure period, corresponding to left and right (and/or top and bottom) phase detection pixels. Each set of data can include two intensity profiles 1201, 1202. Each intensity profile 1201, 1202 can include values of a respective PD sharing a common microlens. For example, and as discussed below, adjacent PD groups 633 can be orthogonal. That is, the respective microlenses 611 of the two PD groups 633 are rotated about the X axis by an angle of 90 degrees from each other (where the X, Y, and Z axes are shown in FIG. 11). As such, some pixels 640 can be useful for autofocus along the Y axis; when the lens is in focus, light passing through the single microlens converges on two effective optical centers having respectively different Y values. Other pixels (not shown) can be useful for autofocus along the Z axis; when the lens is in focus, light passing through the single microlens converges on two effective optical centers having respectively different Z coordinates. A intensity profile 1201 may thus only include measurements from first PDs 634 that are oriented in a common direction (e.g., with effective optical centers having respectively different Y coordinates).

Some of the operations of FIG. 18, which are further discussed below, generally cause imaging assembly 400 to mechanically adjust until peak-to-peak distance 1203 (also called a phase difference) reaches (e.g., approximately reaches) a predetermined value. The predetermined value may be a known dimension 1203 (also called minimum phase difference), which represents the distance between effective optical centers 1104, 1105 when light from the region of interest is optimally focused. The minimum phase difference can be determined at the time of manufacturing imaging sensor 412. As discussed above, a microlens 611 having a substantially planar top surface 611b converges light on two different areas of respective PDs 634 and 635, resulting in a non-zero minimum phase difference at the optimum focal length.

Figure 14:
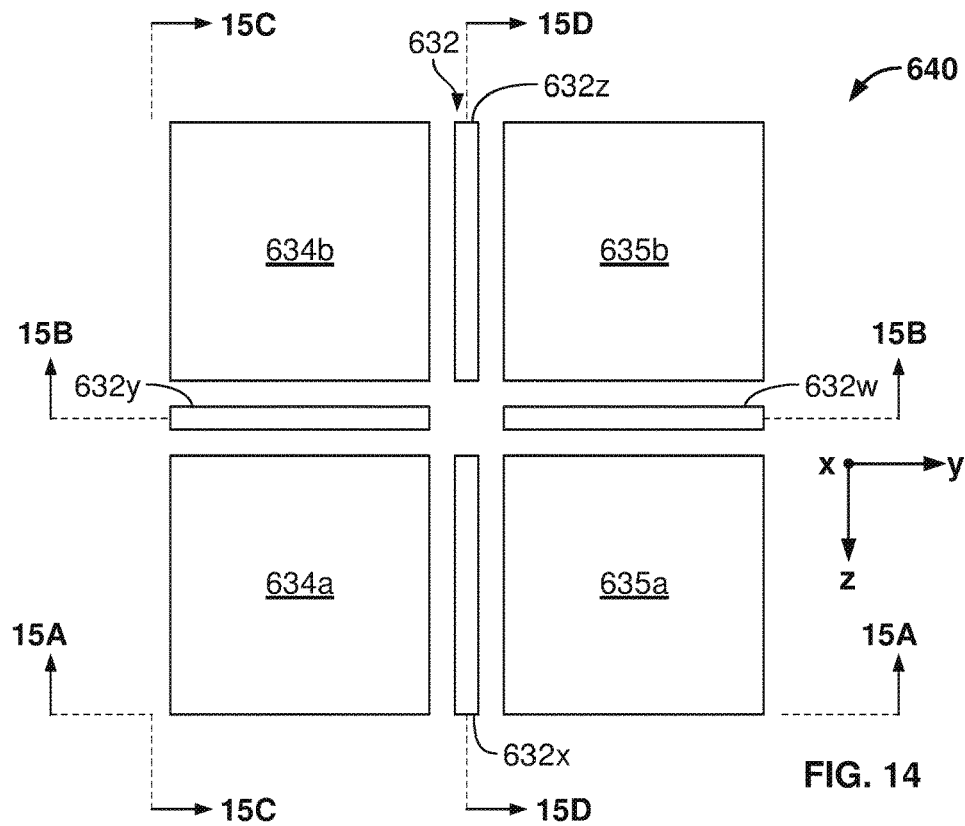
FIG. 14 is a plan view of the photodiodes of one of the pixels shown in FIG. 13.

The PD group 633 of each pixel 640 may include any suitable number of PDs 634, 635. In FIGS. 13-15 and 17, each PD group 633 can include four different PDs 634a, 634b, 635a, 635b. Barriers 632 can be arranged in a crossing pattern to separate adjacent PDs in PD group 633 along the Y and Z axes. As shown in FIG. 14, a single barrier 632 can include a plurality of different and non-contacting sub-barriers 632w, 632x, 632y, 632z.

Figure 15:
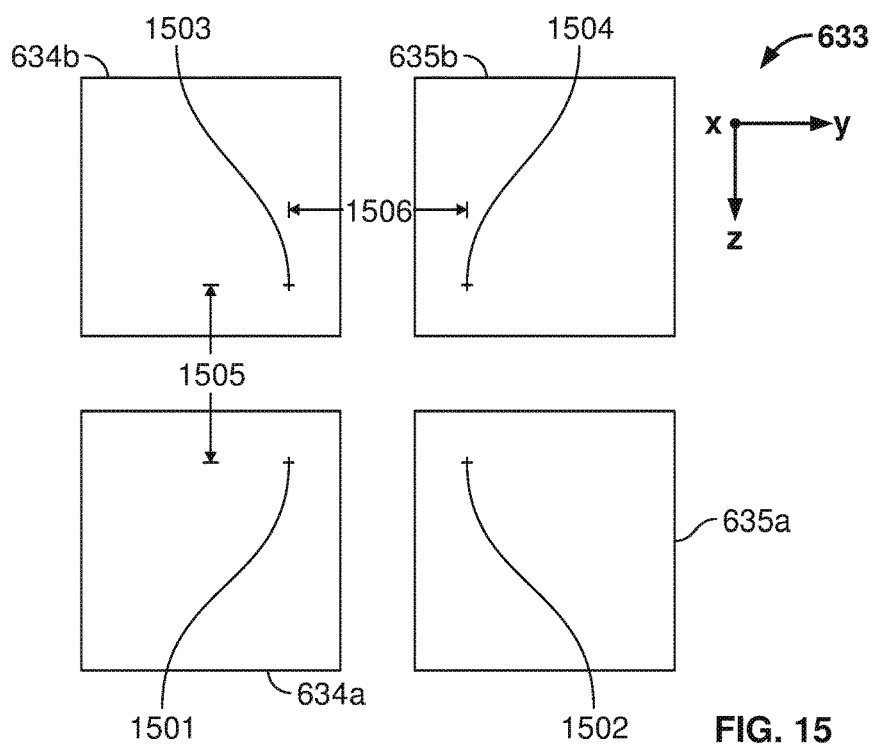
FIG. 15 is a schematic view of the photodiodes of FIG. 13, showing the optical centers of received light.
Figure 15A:
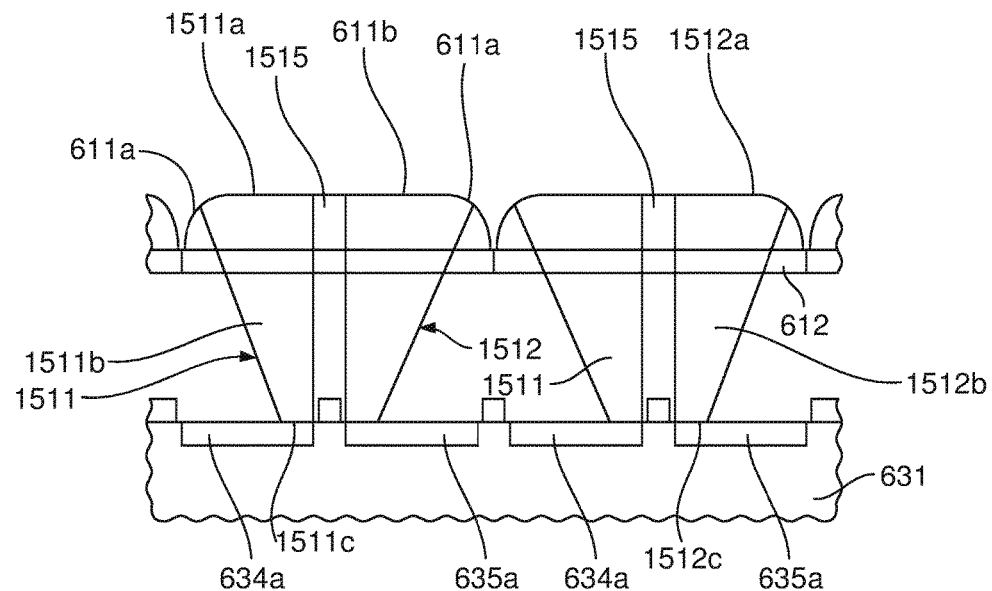
FIGS. 15A-15D are cross sectional views of the photodiodes of FIG. 14 while receiving light, taken along respective section lines 15A-15A, 15B-15B, 15C-15C, and 15D-15D of FIG. 14.
Figure 15B:
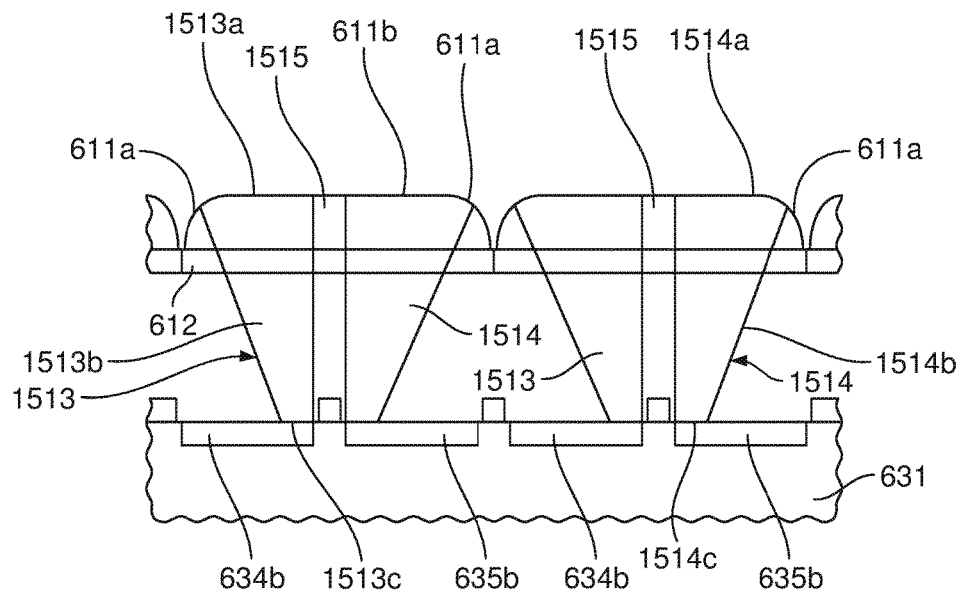
Figure 15C:
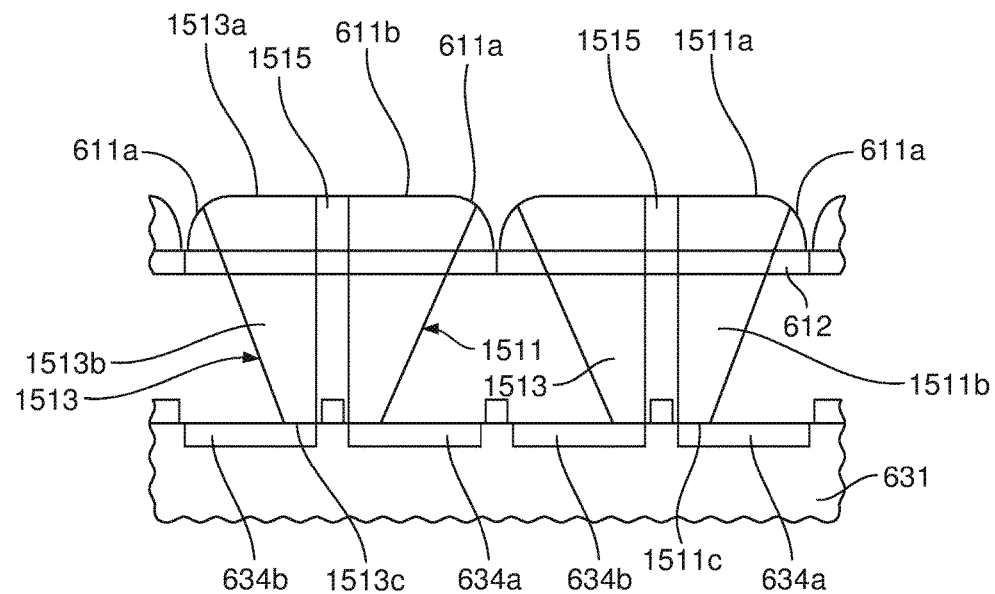
Figure 15D:
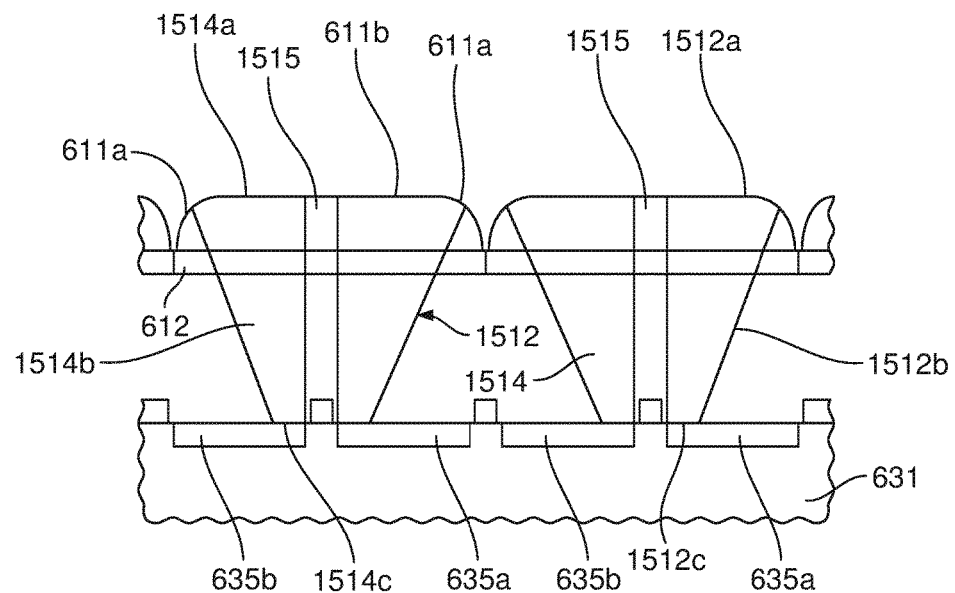

As shown in FIGS. 13 and 15, a common microlens 611 (FIG. 13) can produce four different optical areas (not shown) with first, second, third, and fourth effective optical centers 1501, 1502, 1503, 1504 (FIG. 15). When incoming light is optimally focused, the difference in Z coordinates between adjacent effective optical centers can be dimension 1505 and the Y-axis distance between adjacent effective optical centers can be dimension 1506.

Besides the smaller shapes and arrangements of the PD groups 633 and barriers 632, any and all features described with reference to the two-PD pixels 640 in FIGS. 6-11 can apply to the four-PD pixels 640 in FIGS. 13-15.

FIGS. 15A, 15B, 15C, 15D show cross sections taken along respective section lines 15A-15A, 15B-15B, 15C-15C, and 15D-15D of FIG. 14. Focused and collimated incoming light 1001 (shown in FIG. 10) includes first, second, third, fourth, and fifth portions 1511-1515.

First portion 1511 is incident on first PD 634a. Second portion 1512 is incident on second PD 635a. Third portion 1513 is incident on third PD 634b. Fourth portion 1514 is incident on fourth PD 635b. Fifth portion 1515, which is incident on barrier 632 and/or the spaces between adjacent PDs 634, 635 is not gathered by any of the photodiodes 634a, 634b, 635a, 635b.

Imaging sensor 412 can include any number (e.g., several millions) of pixels 640. In some embodiments, each pixel 640 can include two PDs. Alternatively, each pixel 640 can include four PDs. In various examples, each pixel 640 can include any suitable number of PDs (e.g., 8 or 16). In some embodiments, every pixel 640 can include the same number of PDs. Alternatively, different pixels 640 can include different numbers of PDs (e.g., some may include one PD, others may include two PDs, and others may include four PDs).

Each pixel 640 can have a red, green, or blue color filter 612, or no color filter if the sensor is a monochrome sensor. The color filters can be arranged in any suitable pattern (e.g., a Bayer pattern). Although not shown, only a portion of the total area of imaging sensor 412 is occupied by pixels 640. Other portions of imaging sensor 412 can include circuitry (e.g., horizontal and vertical registers) to measure outputs of pixels 640. Further, adjacent pixels 640 can be separated by circuitry.

Two-PD pixels: If multiple two-PD pixels 640 are present, then the first and second PDs 634, 635 of each PD group 633 can be arranged in the same directions. Alternatively, some PD groups 633 can be rotated with respect to other PD groups 633. For example, half of the PD groups 633 can have the orientations shown in FIG. 11 (with the PDs separated in the y direction) and the other half of the PD groups 633 can have orientations perpendicular to those shown in FIG. 11 (e.g. with the PDs separated in the z direction). Alternatively, the imaging sensor 412 can predominantly comprise pixels having a left PD and a right PD, and be sparsely populated with pixels having a top PD and a bottom PD. Such an arrangement enables autofocus in two-dimensions.

As a result, and with reference to FIG. 12, a phase detection intensity profile can be collected: a first intensity profile corresponding to first PDs 634 in the orientation of FIG. 11, a second intensity profile corresponding to second PDs 635 in the orientation of FIG. 11, a third intensity profile corresponding to first PDs 634 perpendicular to the orientation of FIG. 11, and a fourth intensity profile corresponding to second PDs 635 perpendicular to the orientation of FIG. 11. In such a case, processing system 300 can perform autofocus to minimize the phase difference, corresponding to placing the peaks of the first and second intensity profiles a predetermined minimum distance apart and/or to place the peaks of the third and fourth intensity profiles a predetermined distance apart.

Four-PD pixels: The same result is obtained if multiple four-PD pixels 640 are included. For example, a first intensity profile can correspond to first PDs 634a, a second intensity profile can correspond to second PDs 635a, a third intensity profile can correspond to third PDs 634b, and a fourth intensity profile can correspond to fourth PDs 635b. The system can determine the phase difference between any two of the PDs 634a, 635a, 634b, 635b of the pixel 640 during autofocus. For example, the autofocus system can determine the phase difference between the peak of the first intensity profile and the peak of the the second, third, or fourth intensity profile. The second intensity profile can be compared to the first, third, or fourth intensity profile. The third intensity profile can be compared to the first, second, or fourth intensity profile. The fourth intensity profile can be compared to the first, second, or third intensity profile.

FIG. 18 is a flow chart showing a series of operations that processing system 300 can be configured to perform to (a) autofocus imaging assembly 400 using phase detection, for example, and (b) enhance resolution of imaging assembly 400 using the extra spatial information from the pixels 640 having a non-ideal microlens (e.g., having planar top surface 611b) and curved peripheral region 611a of the top surface. FIG. 18 is only one example of operations consistent with the present application.

At block 1802, one or more regions of interest within the field of view of the sensor can be selected by a user (e.g., by touching a focus point in a region on a display 102, 122) or by processing system 300 automatically. Each region of interest can correspond to a two-dimensional area of a scene 501 to be brought into focus. Alternatively, or in addition, each focal point can correspond to one or more pixels 640 (processing system 300 can store a map linking each selected focal point to a corresponding group of pixels 640).

At block 1804, an autofocus operation is initiated to bring light from the region of interest into focus at the plane of the imaging sensor 412. For example, processing system 300 can command imaging assembly 400 to expose imaging sensor 412 to incoming light. Within each pixel, light passing through the microlens of the pixel converges on the optical areas of each photodiode of the pixel.

Because different color filters 612 impact the measured luminance, processing system 300 can normalize responses of pixels 640. For example, processing system 300 can (a) multiply responses of PDs under green color filters 612 by a first value (e.g., one), (b) multiply responses of PDs under blue color filters 612 by a second value, and (c) multiply responses of PDs under red color filters 612 by a third value. Operators other than multiplication can be applied.

At block 1806, processing system 300 can determine the phase difference between the PDs in each PD group. At block 1806, processing system 300 can determine the phase difference between left PD 634a and right PD 635a, and/or the difference between top PD 634b and bottom PD 634a.

At block 1808, processing system 300 can compare the phase difference to a predetermined minimum phase difference value corresponding to optimal focus for a region of interest within the field of view of the sensor. For this purpose, the phase difference corresponds to the dimension between the light intensity peaks detected by a left photodiode and a right photodiode, such as peak-to-peak distance 1203 (FIG. 12). As discussed above, with an ideal paraboloid microlens, the phase difference at optimal focus is zero, but for the flattened, non-ideal microlens, the phase difference at optimal focus is a non-zero value. Processing system 300 can store one or more predetermined values corresponding to different types of PD. As stated above, the predetermined values can be determined at the time of manufacturing. The predetermined minimum phase difference values can be the distances between optical centers when incoming light 1001 is in-focus. When all pixels 640 are identically oriented and include two PDs (i.e., all left-and-right PDs, or all top-and-bottom PDs), the predetermined value can be distance 1103 of FIG. 11. When all pixels 640 include four PDs, the values can be distances 1505 and 1506 of FIG. 15.

At block 1810, processing system 300 can command imaging assembly 400 to focus based on one or more of the phase differences. The processing system 300 determines a lens positioning command, based on the comparison between the measured phase difference and the minimum phase difference at optimal focus. Processing system 300 can be configured to perform block 1810 such that after adjusting the lens based on the lens positioning command, the phase difference between left and right photodiodes is substantially equal to the predetermined minimum phase difference value(s). Blocks 1804-1810 can represent a phase detection autofocus technique.

In block 1811, the processing system 300 controls the mobile device 100 to capture an image. The sensor voltages are zeroed out, and the imaging sensor 412 is exposed to incoming light from the region of interest for an exposure period, which can be automatically determined by the processor 301. The photodiodes of the imaging sensor 412 accumulate charge according to the intensity of the light received by each pixel.

In block 1812, processing system 300 can perform one or more interpolation techniques to resample the measurements (e.g., voltage values representing luminance values) of pixels 640 to correspond to a set of evenly spaced pixel values, which can be processed using image processing techniques for an evenly spaced pixel array.

At block 1814, processing system 300 can save the interpolated values as an image file. In some embodiments, the resampled image data are processed according to an image processing chain for a uniformly spaced sensor array having uniformly spaced pixels, and saved in Joint Photographic Experts Group (JPEG) or Tagged Image File Format (TIFF). For example, the image processing operations can include demosaicing, white balance, cross talk reduction, noise reduction, sharpening, image filtering, lens artifact or defect correction, or the like.

The raw and non-interpolated measurements (voltages representing luminance values of each PD can be output in a RAW format file. Alternatively, the imaging sensor 412 can include on-chip circuitry to perform the bilinear or bicubic interpolation to resample the image data, and output the resampled image data in a RAW file format.

At block 1816, processing system 300 can: resample the raw data and store results of the resampling (interpolation); and/or (b) command display elements (e.g., LEDs, OLEDs) of a display to light up based on each processed image pixel.

At block 1818, processing system 300 can transmit the image file over an external communications interface 309.

An image can be represented as a two-dimensional matrix with a plurality of display pixels. Each display pixel can correspond to a unit of resolution of the image and can include RGB data or luminance and chrominance data. The RGB data include a red value, a green value, and a blue value. A processing system 300 displaying the image can then illuminate a liquid crystal display (LCD) or light emitting diodes ("LEDs") (e.g. OLEDs, micro LEDs) based on each RGB coordinate.

Besides color interpolation techniques, processing system 300 can resample the image data so the pixels in each resampled row are uniformly spaced. As noted above in the discussion of FIG. 15, the microlenses 611 cause the light to converge on locations centered at positions 1501-1504. The positions 1501-1504 (the effective optical centers) are offset from the centroids of the two-dimensional area of each photodiode 634a, 634b, 635a, 635b. The distance 1505 between effective optical centers among adjacent photodiodes 634a, 634b, 635a, 635b can be shorter than one half the size of the pixel (i.e., less than one half of the centroid-to-centroid distance between adjacent microlenses). The distance between the optical centers 1501-1504 of the photodiodes 634a, 634b, 635a, 635b and the optical centers of the nearest photodiode in a neighboring pixel (not shown) is longer than one half the size of the pixel. Thus, the distances between effective optical centers of successive photodiodes along a row alternates between short-long-short-long.

Because many image processing techniques are based on uniform spacing between pixels, resolution enhancement is achieved by resampling (e.g., using interpolation) to provide uniformly spaced resampled pixels. The number of resampled pixels can equal the number of photodiodes, and each resampled pixel can be located at a centroid of a respective photodiode.

Resampling Block 302d (FIG. 3) of processing system 300 provides a means for resampling the luminance values by interpolating among the received luminance values to determine respective resampled luminance values of a plurality of resampled pixels having respective optical centers located at respective centroids of each of the plurality of photodiodes.

For example, resampling Block 302d of processing system 300 can perform bilinear or bicubic interpolation to estimate or approximate how resampled pixels located at the centroids of PDs 634, 635, 634a, 635a, 634b, 635b would respond to the same scene. Because the resampled pixels are themselves evenly spaced, the resampled image data correspond to an array having a set of evenly spaced pixels at the location of the centroid of each photodiode. That is, the locations of the resampled pixels can match the locations of the corresponding photodiodes. For a sensor having two photodiodes per pixel (i.e., two photodiodes per microlens), the resampled image data provides an enhanced resolution of between one and two times the resolution of a similarly sized sensor having one photodiode per microlens. (The amount of the resolution enhancement depends on the distance between the effective optical center of the first photodiode and the effective optical center of the second photodiode. A larger distance between effective optical centers leads to larger resolution enhancement.) Similarly, for a sensor having four photodiodes per pixel, the resampled image data provide a resolution of between one and four times the resolution of a similarly sized sensor having one photodiode per microlens.

For bicubic interpolation, illuminance values from at least five photodiodes are used, including a first PD for which a resampled pixel is being computed and adjacent PDs on left, right, top and bottom sides of the first PD. For example, referring to FIG. 17, using bicubic interpolation, the luminance values of PDs 634a, 634b, 635a, a fifth PD 1711 to the left of PD 634a, and a sixth PD 1712 below PD 634a (all measured at their respective effective optical centers 1501-1503) can be used to find a resampled luminance value of a resampled pixel located at the centroid 1701 of photodiode 634a.

Alternatively, using bilinear interpolation, illuminance values of at least three PDs are used, including an adjacent PD to the left or right of the PD for which a resampled pixel is being computed, and an adjacent PD above or below the PD for which a resampled pixel is being computed. For example, luminance values of PD 634a, PD 1711, and PD 1712 at their respective optical centers can be used to find a resampled luminance value of a resampled pixel located at the centroid 1701 of photodiode 634a.

Figure 16:
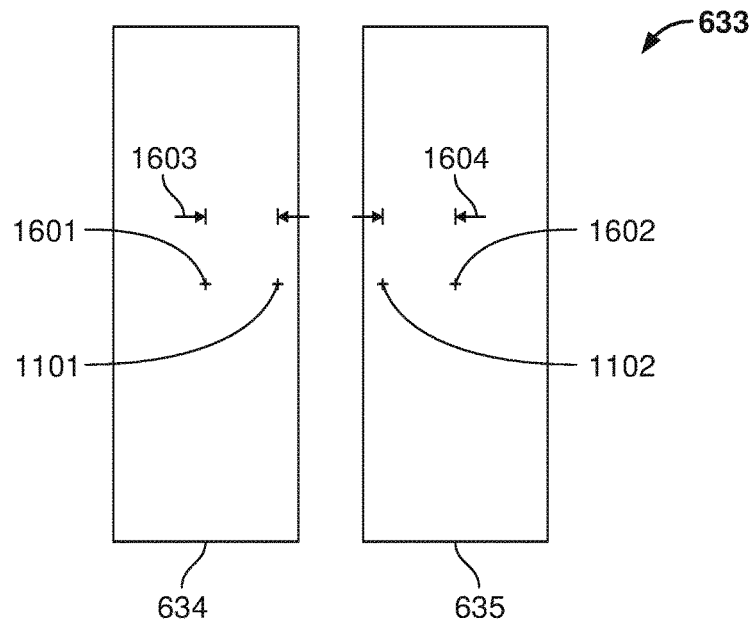
FIG. 16 is a schematic view of a pair of photodiodes receiving in-focus light.

Two-PD pixels: Referring to FIG. 16, first PD 634 can have a first centroid 1601 and second PD 635 can have a second centroid 1602. During block 1812, processing system 300 can perform the bicubic or bilinear interpolation described above to estimate the resampled luminance value of a resampled pixel having an optical center at the centroid 1601 of the two-dimensional area of photodiode 634.

Processing system 300 can perform the same bicubic or bilinear interpolation techniques discussed above to estimate the resampled luminance value of a resampled pixel having an optical center at the centroid 1602 of the two-dimensional area of photodiode 635. Distances 1603 and 1604 between the locations of the effective optical centers 1101, 1102 and the corresponding locations 1601, 1602 of the resampled PDs may be equal magnitudes and opposite signs.

The interpolation of each pixel 640 depends on the amount of offset between microlens 611 and PD group 633. Processing system 300 can perform this interpolation on all pixels 640 to resample all of the pixels 640 in the imaging sensor 412.

Figure 17:
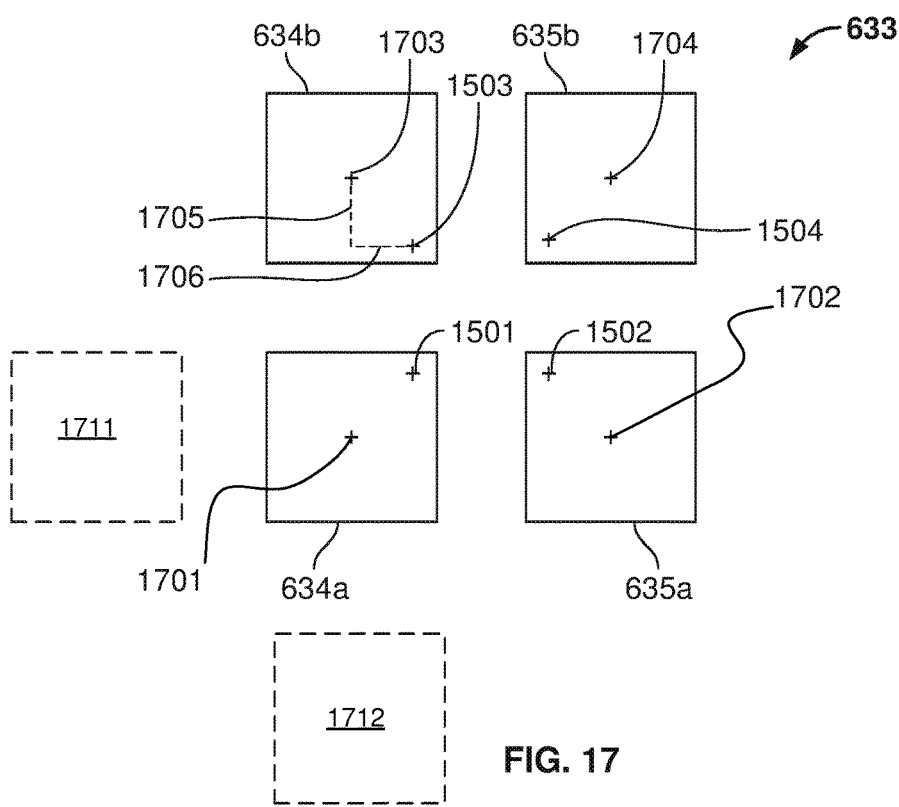
FIG. 17 is a schematic view of a pixel having four photodiodes receiving in-focus light.

Four-PD pixels: Referring to FIG. 17, first through fourth PDs 634a, 635a, 634b, 635b can have first through fourth centroids 1701-1704. In block 1812, processing system 300 can perform interpolation to estimate or approximate the luminance values of first through fourth PDs 634a-635b if the optical centers of light 1501-1504 were respectively located at the centroids 1701-1704.

The magnitudes of each distance 1705, 1706 can be equal for each PD 634a-635b and the signs may adjust accordingly. For example: PD 634b can have a negative first distance 1705 and a negative second distance 1706 while PD 635a can have a positive first distance 1705 and a positive second distance 1706. PDs 634a and 635b can each have one positive distance and one negative distance. If each PD 634a-635b is a square, then the magnitudes of first and second distances 1705, 1706 can be equal.

In both the two-PD case and the four-PD case, the interpolation of each pixel 640 depends on the amount of offset between microlens 611 and PD group 633. Processing system 300 can perform this interpolation on all pixels 640

While the features, methods, devices, and systems described herein can be embodied in various forms, some exemplary and non-limiting embodiments are shown in the drawings, and are described above. Some of the components described in this disclosure are optional, and some implementations can include additional, different, or fewer components from those expressly described in this disclosure. Relative terms (e.g., lower, horizontal, up, down, bottom, etc.) are provided for convenience in understanding the figures and does not limit the subject matter of the disclosure.

The subject matter has been described with illustrative examples. The claimed inventions are not limited to these examples. Changes and modifications can be made to the claimed inventions without departing from their spirit. It is intended that the claims cover such changes and modifications.

I claim:

1. An imaging system comprising:
   an image sensor comprising a pixel, the pixel comprising first and second photodiodes sharing a common microlens, the common microlens being configured to simultaneously converge in-focus light onto a first area of the first photodiode and in-focus light onto a second area of the second photodiode, an effective optical center of the first area of the first photodiode being offset from a centroid of the first photodiode, an effective optical center of the second area of the second photodiode being offset from a centroid of the second photodiode; and
   one or more processors configured to:
      receive a first luminance value of the first area from the first photodiode;
      receive a second luminance value of the second area from the second photodiode; and
      resample a plurality of luminance values, including the first luminance value and the second luminance value, to provide a luminance value of a first resampled pixel having an optical center located at the centroid of the first photodiode using at least the first and second luminance values, and to provide a luminance value of a second resampled pixel having an optical center located at the centroid of the second photodiode using at least the first and second luminance values.

2. The imaging system of claim 1, where the first photodiode and the second photodiode are configured to generate the first and second luminance values during a single exposure period.

3. The imaging system of claim 2, wherein the common microlens at least partially covers each of the first photodiode and the second photodiode.

4. The imaging system of claim 2, wherein the common microlens comprises a bottom surface above the first photodiode and the second photodiode and a top surface above the bottom surface, the top surface comprising a peripheral region and a central region; the peripheral region having a curvature and the central region being substantially planar or having a curvature more gradual than the curvature of the peripheral region.

5. The imaging system of claim 1, wherein the one or more processors are configured to resample the plurality of luminance values by:
   performing interpolation using the first luminance value and the second luminance value to provide the first and second resampled pixels; and
   performing image processing on the first and second resampled pixels.

6. The imaging system of claim 1, wherein the resampling includes performing a bilinear interpolation over luminance values including the first luminance value and the second luminance value.

7. The imaging system of claim 6, wherein the one or more processors are configured to process an image based on the resampled pixels, the image having a resolution greater than a total number of microlenses in the image sensor.

8. The imaging system of claim 7, wherein the one or more processors are configured to process the image such that the luminance value of the first resampled pixel and the luminance value of the second resampled pixel are different from each other.

9. The imaging system of claim 1, wherein the one or more processors are configured to perform a phase detection autofocus based on a phase difference value determined from the first and second photodiodes.

10. The system of claim 1, wherein the one or more processors are configured to:
    resample a first plurality of luminance values that include the first luminance value and the second luminance value to provide a luminance value of a first resampled pixel having the optical center located at the centroid of the first photodiode; and
    resample a second plurality of luminance values that include the first luminance value and the second luminance value to provide a luminance value of a second resampled pixel having an optical center located at the centroid of the second photodiode.

11. A method of imaging with a sensor having a plurality of pixels, at least one of the plurality of pixels comprising first and second photodiodes, the method comprising:
    receiving a first luminance value from the first photodiode and a second luminance value from the second photodiode, wherein the first photodiode and the second photodiode share a common microlens, the common microlens configured so light from a first area is gathered by the first photodiode and has an effective optical center at a first location offset from a centroid of the first photodiode, and so light from a second area is gathered by the second photodiode and has an effective optical center at a second location offset from a centroid of the second photodiode, the second location being different from the first location; and
    resampling by interpolating among a plurality of luminance values collected by the sensor, including the first luminance value and the second luminance value, to determine a resampled luminance value of a pixel located at a centroid of the first photodiode in an evenly spaced row of pixels using at least the first luminance value and the second luminance value.

12. The method of claim 11, wherein, after the resampling, a resampled set of luminance values from the sensor has a resolution greater than a total number of microlenses on the sensor.

13. The method of claim 11, wherein the first area and the second area are partially overlapping regions in a scene.

14. The method of claim 11, wherein the interpolating includes bilinear interpolation or bicubic interpolation.

15. The method of claim 11, wherein the common microlens comprises a bottom surface above the first photodiode and the second photodiode and a top surface above the bottom surface, the top surface comprising a peripheral region and a central region;

the peripheral region having a curvature and the central region being substantially planar or having a curvature more gradual than the curvature of the peripheral region.

16. The method of imaging according to claim 11, further comprising performing phase detection autofocus based on a phase difference value determined using the first photodiode and the second photodiode.

17. An imaging system, comprising:

means for receiving luminance values from a plurality of photodiodes sharing a common microlens, such that the luminance values represent light gathered by each respective one of the plurality of photodiodes, and the light gathered by each respective photodiode has an effective optical center at a respective location that is offset from a respective centroid of the respective photodiode; and means for resampling the luminance values by interpolating among the received luminance values to determine respective resampled luminance values of a plurality of resampled pixels having respective optical centers located at respective centroids of each of the plurality of photodiodes, the resampled luminance values being determined using at least a first one of the luminance values received from a first one of the plurality of photodiodes and a second one of the luminance values received from a second one of the plurality of photodiodes.

18. The imaging system of claim 17, further comprising means for generating a lens positioning signal for a lens, based on a phase difference determined using at least two of the plurality of photodiodes.

19. The imaging system of claim 18, wherein the means for generating a lens positioning signal for the lens is configured to:

detect a phase difference between light arriving at the first one of the plurality of photodiodes and light arriving at the second one of the plurality of photodiodes; and generate the lens positioning signal for positioning the lens so that the phase difference between light arriving at the first one of the plurality of photodiodes and light arriving at the second one of the plurality of photodiodes has a predetermined non-zero value.

20. The imaging system of claim 17, wherein the means for receiving luminance values is configured to receive the first one of the luminance values from the first one of the plurality of photodiodes and the second one of the luminance values from the second one of the plurality of photodiodes.

21. A non-transitory, machine-readable storage medium comprising computer program code for processing image sensor data, the computer program code comprising:

code for receiving luminance values from a plurality of photodiodes sharing a common microlens, such that the luminance values represent light gathered by each respective one of the plurality of photodiodes, and the light gathered by each respective photodiode has an effective optical center at a respective location that is offset from a respective centroid of the respective photodiode; and code for resampling the luminance values by interpolating among the received luminance values to estimate respective resampled luminance values of a plurality of resampled pixels having respective optical centers located at respective centroids of each of the plurality of photodiodes, the resampled luminance values being determined using at least a first one of the luminance values received from a first one of the plurality of photodiodes and a second one of the luminance values received from a second one of the plurality of photodiodes.

22. The storage medium of claim 21, wherein the computer program code further includes code to generate a lens position command for adjusting a lens until a phase difference between light received by the first one of the plurality of photodiodes and light received by the second one of the plurality of photodiodes reaches a predetermined non-zero value.

* * * * *